United States Patent
Yang et al.

(10) Patent No.: US 11,437,271 B2
(45) Date of Patent: Sep. 6, 2022

(54) SEAMLESS GAP FILL

(71) Applicant: Applied Materials, Inc., Santa Clara, CA (US)

(72) Inventors: Yixiong Yang, Fremont, CA (US); Srinivas Gandikota, Santa Clara, CA (US); Wei Liu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/867,092

(22) Filed: May 5, 2020

(65) Prior Publication Data

US 2021/0351074 A1 Nov. 11, 2021

(51) Int. Cl.
*H01L 21/768* (2006.01)
*H01L 21/321* (2006.01)

(52) U.S. Cl.
CPC .. *H01L 21/76882* (2013.01); *H01L 21/32115* (2013.01)

(58) Field of Classification Search
None
See application file for complete search history.

(56) References Cited

U.S. PATENT DOCUMENTS

| | | | |
|---|---|---|---|
| 7,494,908 B2 | 2/2009 | Chung et al. | |
| 7,745,332 B1 * | 6/2010 | Shaviv | H01L 21/76865 438/679 |
| 7,781,326 B2 | 8/2010 | Seutter et al. | |
| 7,897,516 B1 * | 3/2011 | Kinder | H01L 21/76805 438/695 |
| 8,298,936 B1 * | 10/2012 | Rozbicki | H01L 21/2855 438/637 |
| 2011/0233778 A1 | 9/2011 | Lee et al. | |
| 2015/0255481 A1 | 9/2015 | Baenninger et al. | |
| 2016/0056077 A1 * | 2/2016 | Lai | H01L 21/02247 438/653 |
| 2017/0084487 A1 * | 3/2017 | Chebiam | H01L 21/76883 |
| 2018/0358264 A1 * | 12/2018 | Wu | H01L 21/7684 |
| 2019/0019724 A1 * | 1/2019 | Cheng | H01L 21/32137 |

FOREIGN PATENT DOCUMENTS

KR 20140029041 A 3/2014

OTHER PUBLICATIONS

PCT International Search Report and Written Opinion in PCT/US2021/030124 dated Aug. 20, 2021, 9 pages.

* cited by examiner

*Primary Examiner* — Benjamin P Sandvik
(74) *Attorney, Agent, or Firm* — Servilla Whitney LLC (57) ABSTRACT

Methods for filling a substrate feature with a seamless gap fill are described. Methods comprise forming a metal film a substrate surface, the sidewalls and the bottom surface of a feature, the metal film having a void located within the width of the feature; treating the metal film with a plasma; and annealing the metal film to remove the void.

15 Claims, 6 Drawing Sheets

SEAMLESS GAP FILL

TECHNICAL FIELD

Embodiments of the disclosure generally relate to methods and systems for manufacturing a semiconductor device. More particularly, embodiments of the disclosure are directed to methods and systems for filling a substrate feature.

BACKGROUND

The semiconductor industry continues to strive for continuous device miniaturization that is driven by the need for mobile and high-performance systems in emerging industries such as autonomous vehicles, virtual reality, and future mobile devices. To accomplish this feat, new, high-performance materials are needed to circumvent inherent engineering and physics issues encountered in rapid reduction of features in microelectronic devices.

In microelectronics device fabrication there is a need to fill narrow trenches having aspect ratios (AR) greater than 10:1 with no voiding for many applications. The film needs to be of high quality throughout the trench. Chemical vapor deposition (CVD) and atomic layer deposition (ALD) are techniques used to deposit film into trenches. The as-deposited film is followed by processing operations such as steam anneals and UV-cures to improve film quality. Approaches often involve multiple deposition-etch-deposition cycles or aggressive radical treatment steps, which can be of high cost and which can be an integration concern for some applications.

As the dimensions of the structures decrease and the aspect ratios increase post curing methods of the as deposited flowable films become difficult, resulting in films with varying composition throughout the filled trench. In 3-dimensional structures, a seam is often observed in the filled trench after the film is deposited. There is a need, therefore, for an improved method to create a seamless gap fill.

SUMMARY

One or more embodiments of the disclosure are directed to a processing method. The processing method comprises forming a metal film on a substrate surface, the substrate surface having at least one feature thereon, the at least one feature having a width defined by a first sidewall and a second sidewall, wherein the metal film is formed on the substrate surface, the first sidewall, the second sidewall, and the bottom surface of the at least one feature, the metal film having a void located within the width of the feature; treating the metal film with a plasma; and annealing the metal film.

Another embodiment of the disclosure is directed to a processing method. The processing method comprising: forming a film stack on a substrate, the film stack comprising a plurality of alternating layers of an oxide material and a nitride material and the film stack having a stack thickness; etching the film stack to form an opening extending a depth from a top of the film stack surface to a bottom surface, the opening having a width defined by a first sidewall and a second sidewall; forming a metal film on the film stack, wherein the metal film is formed on the top of the film stack surface, the first sidewall, the second sidewall, and the bottom surface of the opening, the metal film having a void located within the width of the opening; treating the metal film with a plasma; and annealing the metal film.

Other embodiments of the disclosure are directed to a non-transitory computer readable medium including instructions, that, when executed by a controller of a processing chamber, causes the processing chamber to perform operations of: forming a metal film on a substrate surface, the substrate surface having at least one feature thereon, the at least one feature having a width defined by a first sidewall and a second sidewall, wherein the metal film is formed on the substrate surface, the first sidewall, the second sidewall, and the bottom surface of the at least one feature, the metal film having a void located within the width of the feature; treating the metal film with a plasma; and annealing the metal film.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" and "wafer" are used interchangeably, both referring to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate (or otherwise generate or graft target chemical moieties to impart chemical functionality), anneal and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface. What a given substrate surface comprises will depend on what films are to be deposited, as well as the particular chemistry used.

One or more embodiments provide systems and methods for treating substrates with high aspect ratio features. Some embodiments provide methods to provide seam-free metal, metal nitride, or metal alloy films to fill high aspect ratio trenches. For example, high aspect ratio features that are to be treated include trenches within 3-dimensional ("3D") structures such as memory and logic devices, such as metal gate layers of logic devices, such as fin field-effect transistors ("FinFET"), gate-all-around field-effect transistors ("GAA FET"), dynamic random-access memory ("DRAM"), and NAND structures.

Embodiments of the disclosure advantageously provide methods and systems for depositing a film (e.g., titanium nitride (TiN)) in high aspect ratio (AR) structures with small dimensions. Some embodiments advantageously provide methods involving deposition-treatment-anneal processes that can be performed in a cluster tool environment. Some embodiments advantageously provide seam-free high quality films to fill up high AR trenches with small dimensions.

Figure 1:
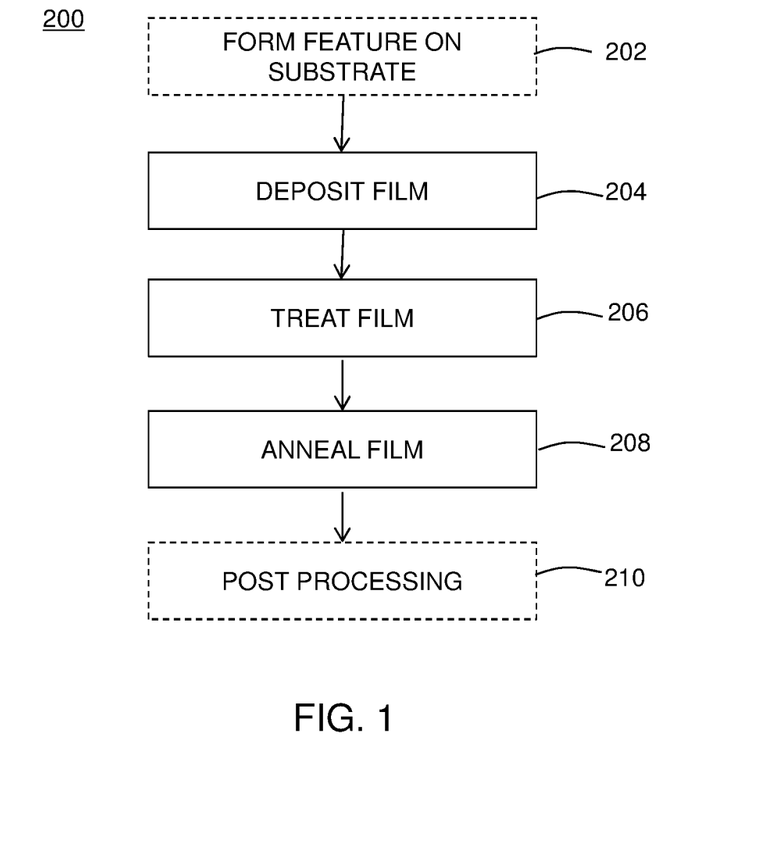
FIG. 1 illustrates a process flow diagram in accordance with one or more embodiments of the disclosure.

FIG. 1 depicts a process flow diagram of an example method 200 for depositing a film in accordance with one or more embodiments of the present disclosure. With reference to FIG. 1, at operation 204 a film is formed on a substrate, the substrate having a feature formed therein. In some embodiments, the feature is formed on the substrate at operation 202. At operation 206, the film is treated with a plasma. At operation 208, the treated film is annealed. The substrate may then proceed to one or more optional post-processing methods at operation 210.

Figure 2:
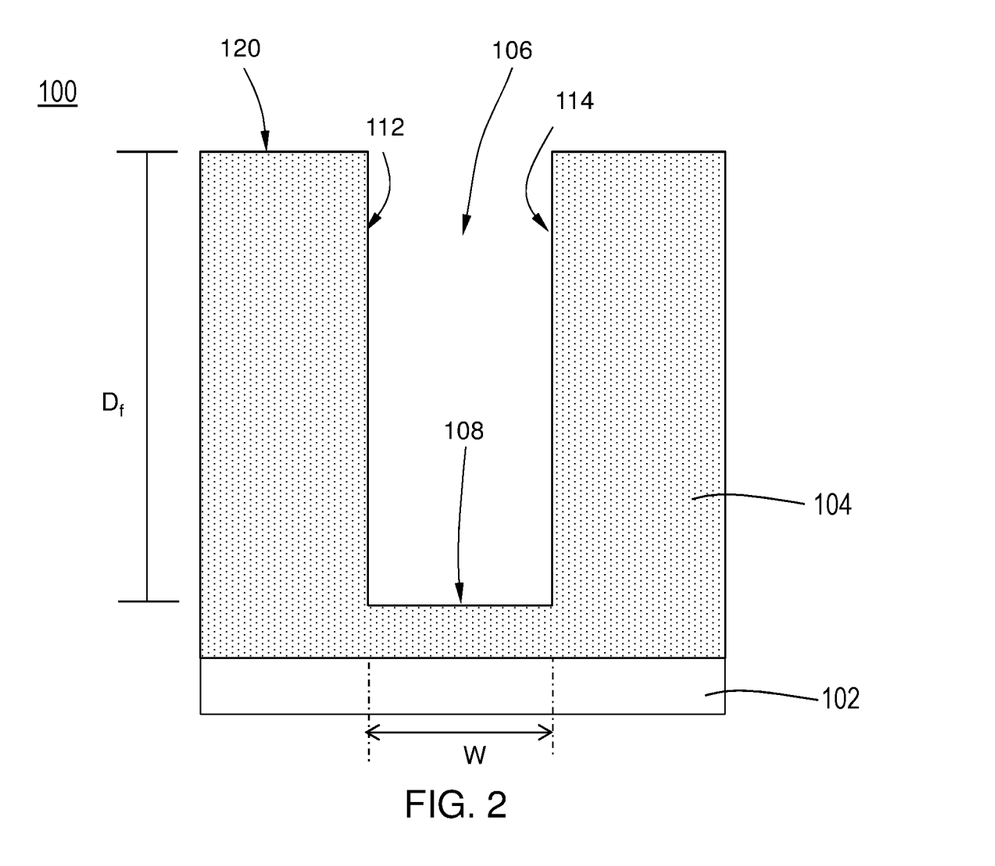
FIG. 2 illustrates a cross-sectional view of an electronic device accordance with one or more embodiments of the disclosure.

FIG. 2 shows a partial cross-sectional view of an electronic device 100 with a feature 106. The Figures show substrates having a single feature for illustrative purposes; however, those skilled in the art will understand that there can be more than one feature. The shape of the feature 106 can be any suitable shape including, but not limited to, trenches and cylindrical vias. As used in this regard, the term "feature" means any intentional surface irregularity. Suitable examples of features include, but are not limited to trenches which have a top, two sidewalls and a bottom, peaks which have a top and two sidewalls. Features can have any suitable aspect ratio (ratio of the depth of the feature to the width of the feature). In some embodiments, the aspect ratio is greater than or equal to about 5:1, 10:1, 15:1, 20:1, 25:1, 30:1, 35:1 or 40:1.

The substrate 100 has a substrate surface 120. The at least one feature 106 forms an opening in the substrate surface 120. The at least one feature 106 extends from the substrate surface 120 to a feature depth $D_f$ to a bottom surface 108. The at least one feature 106 has a first sidewall 112 and a second sidewall 114 that define a width W of the at least one feature 106. The open area formed by the sidewalls 112, 114 and bottom 108 are also referred to as a gap. In one or more embodiments, the width W is homogenous along the depth $D_f$ of the at least one feature 106. In other embodiments, the width, W, is greater at the top of the at least one feature 106 than the width, W, at the bottom surface 108 of the at least one feature 106.

In one or more embodiments, the substrate 100 is a film stack comprising a plurality of alternating layers of a nitride material and an oxide material deposited on a semiconductor substrate 102.

The semiconductor substrate 102 can be any suitable substrate material. In one or more embodiments, the semiconductor substrate 102 comprises a semiconductor material, e.g., silicon (Si), carbon (C), germanium (Ge), silicon germanium (SiGe), gallium arsenide (GaAs), indium phosphate (InP), indium gallium arsenide (InGaAs), indium aluminum arsenide (InAlAs), germanium (Ge), silicon germanium (SiGe), copper indium gallium selenide (CIGS), other semiconductor materials, or any combination thereof. In one or more embodiments, the semiconductor substrate 102 comprises one or more of silicon (Si), germanium (Ge), gallium (Ga), arsenic (As), indium (In), phosphorus (P), copper (Cu), or selenium (Se). Although a few examples of materials from which the substrate 102 may be formed are described herein, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In one or more embodiments, the at least one feature 106 comprises one or more of a memory hole, a word line slit, and a trench in a memory or logic chip. Accordingly, in one or more embodiments, the substrate 100 comprises a memory device or a logic device, e.g. NAND, VNAND, DRAM, or the like.

As used herein, the term "3D NAND" refers to a type of electronic (solid-state) non-volatile computer storage memory in which the memory cells are stacked in multiple layers. 3D NAND memory generally includes a plurality of memory cells that include floating-gate transistors. Traditionally, 3D NAND memory cells include a plurality of NAND memory structures arranged in three dimensions around a bit line.

As used herein, the term "dynamic random access memory" or "DRAM" refers to a memory cell that stores a datum bit by storing a packet of charge (i.e., a binary one), or no charge (i.e., a binary zero) on a capacitor. The charge is gated onto the capacitor via an access transistor, and sensed by turning on the same transistor and looking at the voltage perturbation created by dumping the charge packet on the interconnect line on the transistor output. Thus, a single DRAM cell is made of one transistor and one capacitor.

Figure 3:
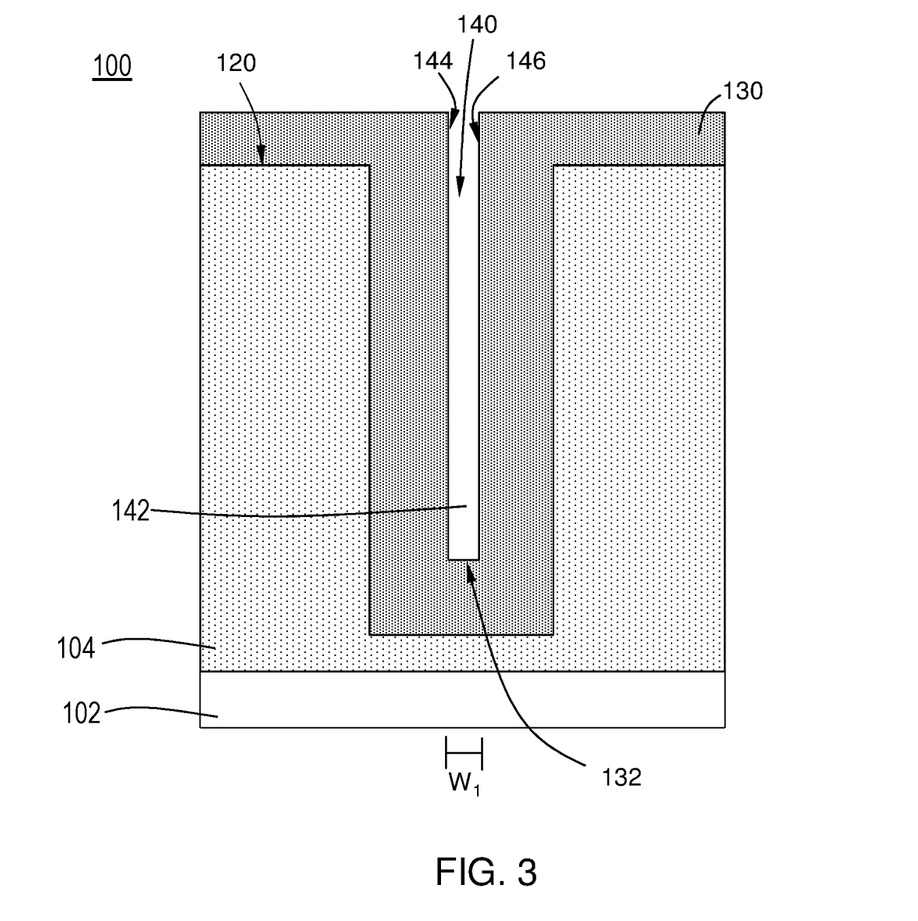
FIG. 3 illustrates a cross-sectional view of an electronic device accordance with one or more embodiments of the disclosure.

FIG. 3 shows a cross-sectional schematic of a gapfill process in accordance with one or more embodiments of the disclosure. With reference to FIG. 3, in one or more embodiments, at least one feature 106 is formed on a substrate 100. In some embodiments, the substrate 100 is provided for processing prior to operation 202. As used in this regard, the term "provided" means that the substrate is placed into a position or environment for further processing. In one or more embodiments, the substrate 100 has at least one feature 106 already formed thereon. In other embodiments, at operation 202, at least one feature 106 is formed on a substrate 100. In one or more embodiments, the at least one feature extends a feature depth, $D_f$, from the substrate surface to a bottom surface, the at least one feature 106 having a width, W, defined by a first sidewall 112 and a second sidewall 114.

In one or more embodiments, at operation 204, a film 130 is formed on the substrate surface 120 and the walls 112, 114 and the bottom of the at least one feature 106. As illustrated in FIG. 3, in one or more embodiments, the film 130 forms with a void or gap 140 located within the width, W, of the at least one feature 106. In one or more embodiments, the void or gap 140 has a first width, $W_1$.

In one or more embodiments, the film 130 can be comprised of any suitable material. In some embodiments, the film 130 comprises a metal nitride. In one or more embodiments, the metal may be selected from one or more of tantalum (Ta), titanium (Ti), tungsten (W), molybdenum (Mo), niobium (Nb), vanadium (V), chromium (Cr), cobalt (Co), aluminum (Al), copper (Cu), rubidium (Rb), and the like. In one or more embodiments, the film comprises one or more of titanium nitride (TiN), tantalum nitride (TaN), tungsten nitride (WN), molybdenum nitride (MoN), titanium aluminum nitride (TiAlN), niobium nitride (NbN), vanadium nitride (VN), chromium nitride (CrN), rubidium nitride (RbN), and the like. In one or more embodiments, the film 140 is formed by atomic layer deposition (ALD) or chemical vapor deposition (CVD), and the like.

"Atomic layer deposition" or "cyclical deposition" as used herein refers to the sequential exposure of two or more reactive compounds to deposit a layer of material on a substrate surface. The substrate, or portion of the substrate, is exposed sequentially or separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially.

In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A, e.g. manganese precursor, ruthenium precursor, or a manganese-ruthenium precursor) is pulsed into the reaction zone followed by a first time delay. Next, a second precursor or compound B (e.g. reductant) is pulsed into the reaction zone followed by a second delay. During each time delay, a purge gas, such as argon, may be introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B, and purge gas is a cycle. A cycle can start with either compound A or compound B and continue the respective order of the cycle until achieving a film with the predetermined thickness.

A "pulse" or "dose" as used herein is intended to refer to a quantity of a source gas that is intermittently or non-continuously introduced into the process chamber. The quantity of a particular compound within each pulse may vary over time, depending on the duration of the pulse. A particular process gas may include a single compound or a mixture/combination of two or more compounds, for example, the process gases described below.

The durations for each pulse/dose are variable and may be adjusted to accommodate, for example, the volume capacity of the processing chamber as well as the capabilities of a vacuum system coupled thereto. Additionally, the dose time of a process gas may vary according to the flow rate of the process gas, the temperature of the process gas, the type of control valve, the type of process chamber employed, as well as the ability of the components of the process gas to adsorb onto the substrate surface. Dose times may also vary based upon the type of layer being formed and the geometry of the device being formed. A dose time should be long enough to provide a volume of compound sufficient to adsorb/chemisorb onto substantially the entire surface of the substrate and form a layer of a process gas component thereon.

The precursor-containing process gas may be provided in one or more pulses or continuously. The flow rate of the precursor-containing process gas can be any suitable flow rate including, but not limited to, flow rates is in the range of about 1 to about 5000 sccm, or in the range of about 2 to about 4000 sccm, or in the range of about 3 to about 3000 sccm or in the range of about 5 to about 2000 sccm. The precursor can be provided at any suitable pressure including, but not limited to, a pressure in the range of about 5 mTorr to about 500 Torr, or in the range of about 100 mTorr to about 500 Torr, or in the range of about 5 Torr to about 500 Torr, or in the range of about 50 mTorr to about 500 Torr, or in the range of about 100 mTorr to about 500 Torr, or in the range of about 200 mTorr to about 500 Torr.

The period of time that the substrate is exposed to the one or more precursor-containing process gas may be any suitable amount of time necessary to allow the precursor to form an adequate nucleation layer atop the conductive surface of the bottom of the opening. For example, the process gas may be flowed into the process chamber for a period of about 0.1 seconds to about 90 seconds. In some time-domain ALD processes, the precursor-containing process gas is exposed the substrate surface for a time in the range of about 0.1 sec to about 90 sec, or in the range of about 0.5 sec to about 60 sec, or in the range of about 1 sec to about 30 sec, or in the range of about 2 sec to about 25 sec, or in the range of about 3 sec to about 20 sec, or in the range of about 4 sec to about 15 sec, or in the range of about 5 sec to about 10 sec.

In some embodiments, an inert carrier gas may additionally be provided to the process chamber at the same time as the precursor-containing process gas. The carrier gas may be mixed with the precursor-containing process gas (e.g., as a diluent gas) or separately and can be pulsed or of a constant flow. In some embodiments, the carrier gas is flowed into the processing chamber at a constant flow in the range of about 1 to about 10000 sccm. The carrier gas may be any inert gas, for example, such as argon, helium, neon, combinations thereof, or the like. In one or more embodiments, a precursor-containing process gas is mixed with argon prior to flowing into the process chamber.

In an embodiment of a spatial ALD process, a first reactive gas and second reactive gas (e.g., nitrogen gas) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

In one or more embodiments, the film 130 is formed on the substrate surface 120, the first sidewall 112 of the feature 106, a second sidewall 114 of the feature 106, and the bottom surface 108 of the feature 106. In some embodiments, the film 130 of the substrate 100 is heated before or while the film is deposited on the substrate. The film 130 may be heated at a temperature of at least 300° C., such as 300° C. to about 1000° C., such as about 400° C. to about 650° C., such as about 400° C. to about 500° C., such as about 450° C. In one or more embodiments, the deposition temperature may be selected based on the film composition, the deposition method, the pressure of the processing chamber, or a combination thereof. In one or more embodiments, forming the film 130 causes a void or gap 140 to be formed. The void or gap 140 extends substantially parallel to the first and second sidewalls 112, 114. The void or gap 140 has a gap first width, $W_1$, defined by a distance between a first gap wall 144 and a second gap wall 146. The width, W1, of the void or gap 140 varies along the void or gap length. The gap first width, W1, refers to the portion of the gap 140 having the largest width along the length of the void or gap 140. In some embodiments, the first width, $W_1$, is in a range of from about 2 Å to about 50 Å, such as from about 2 Å to about 20 Å, such as from about 3 Å to about 10 Å, as measured by TEM.

In some embodiments, the film 130 forms conformally on the at least one feature 106. As used herein, the term "conformal", or "conformally", refers to a layer that adheres to and uniformly covers exposed surfaces with a thickness having a variation of less than 1% relative to the average thickness of the film. For example, a 1,000 Å thick film would have less than 10 Å variations in thickness. This thickness and variation includes edges, corners, sides, and the bottom of recesses. For example, a conformal layer deposited by ALD in various embodiments of the disclosure would provide coverage over the deposited region of essentially uniform thickness on complex surfaces.

In some embodiments, the film 130 is a continuous film. As used herein, the term "continuous" refers to a layer that covers an entire exposed surface without gaps or bare spots that reveal material underlying the deposited layer. A continuous layer may have gaps or bare spots with a surface area less than about 1% of the total surface area of the film.

Figure 4:
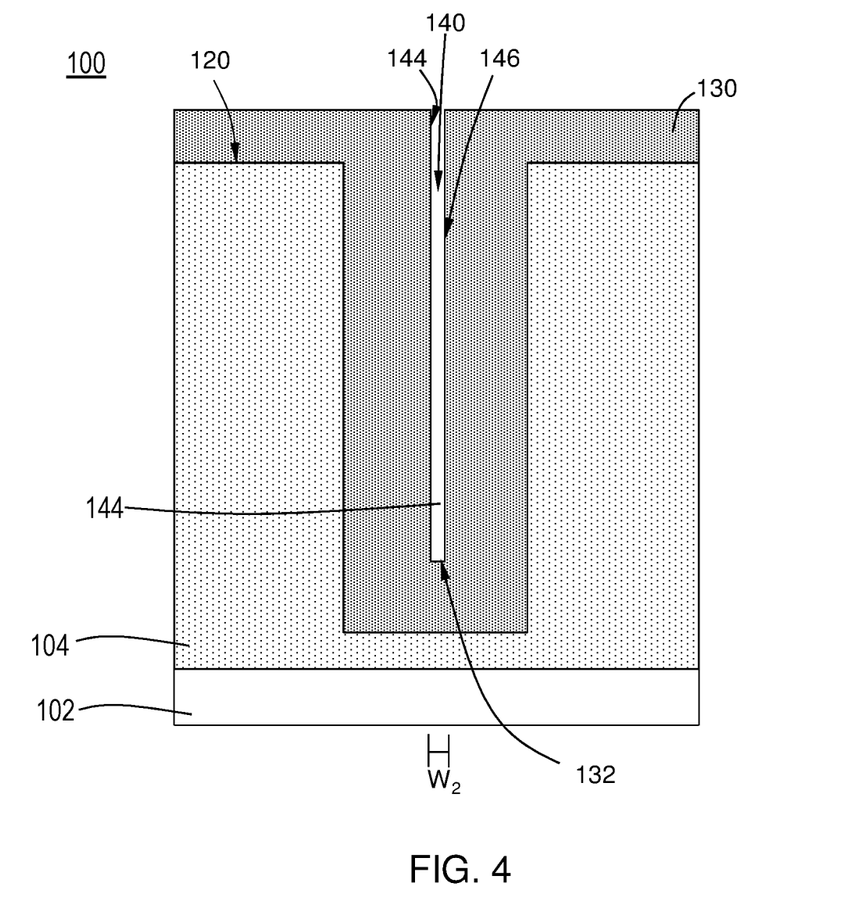
FIG. 4 illustrates a cross-sectional view of an electronic device accordance with one or more embodiments of the disclosure.

With reference to FIGS. 3 and 4, in one or more embodiments, a void or gap 140 is formed within the width of the at least one feature 106. The void or gap 140 is illustrated as a rectangular opening in the film 130. Those skilled in the art, however, will understand that this is merely for illustrative purposes. The shape and size of the void or gap 140 can vary.

Referring to FIG. 1 and FIG. 4, in one or more embodiments, at operation 206, the film 130 is treated. In one or more embodiments, treatment comprises exposing the device 100 to a plasma. In one or more embodiments, treatment comprises exposing the film 130 and the void or gap 140 to a plasma. In one or more embodiments, the plasma comprises nitrogen ($N_2$). In some embodiments, the plasma causes the film 130 to become a metal rich film. Without intending to be bound by theory, it is thought that the plasma treatment causes the concentration of nitrogen to decrease in the film 130.

Referring to FIG. 4, after the device 100 is treated with plasma, the width of the void or gap 140 changes to second width, $W_2$. In one or more embodiments the second width is less than the first width, $W_1$. The void or gap 140 extends substantially parallel to the first and second sidewalls 112, 114. The void or gap 140 has a gap second width, $W_2$, defined by a distance between a first gap wall 144 and a second gap wall 146. The second width, $W_2$, of the void or gap 140 varies along the void or gap length. The gap second width, $W_2$, refers to the portion of the gap 140 having the largest width along the length of the void or gap 140. In some embodiments, the second width, $W_2$, is in a range of from about 2 Å to about 50 Å, such as from about 2 Å to about 20 Å, such as from about 3 Å to about 10 Å, as measured by TEM.

In some embodiments, operation 206 occurs in the first processing chamber. In some embodiments, operation 206 occurs in a second processing chamber having a second processing volume. The device 100 depicted in FIG. 4 having a film 130 thereon is positioned into a second processing chamber having a second processing volume and exposed to a nitrogen plasma. In some embodiments, the film 130 of the substrate 100 is heated at a temperature of at least 300° C., such as from about 300° C. to about 1000° C., such as from about 400° C. to about 650° C., such as from about 400° C. to about 500° C., such as about 450° C. In some embodiments, the second processing volume is maintained at below atmospheric pressure. In one or more embodiments, the pressure at operation 206 is maintained at about 0.2 torr to about 5 torr, such as about 0.3 torr to about 5 torr, such as about 0.5 torr to about 5 torr, such as about 2 torr to about 4 torr, such as about 3 torr. In an embodiment, the pressure in the second processing volume is from about 0.2 torr to about 5 torr, such as from about 0.3 torr to about 5 torr, such as about from about 0.5 torr to about 5 torr, such as from about 2 torr to about 4 torr, such as about 3 torr. In some embodiments, a nitrogen radical is formed in the plasma source. In one or more embodiments, the plasma source is selected from a remote plasma source, an inductively coupled plasma source, and a microwave plasma source. In some embodiments, the plasma source includes an excitation source such as a radio frequency (RF). At operation 206, the RF power for plasma generation is from about 1 kW to about 10 kW, such as from about 5 kW to about 9 kW, such as about 8 kW. In one or more embodiments, the RF power for plasma generation is less than about 11 kW, including about 10 kW, about 9 kW, about 8 kW, about 7 kW, about 6 kW, about 5 kW, about 4 kW, about 3 kW, about 2 kW, and about 1 kW. In one or more embodiments, the nitrogen radical is formed outside of the processing volume and flowed into the processing volume, or the nitrogen radical is formed inside the processing volume.

For radicals formed inside the processing volume, it has been found that operating a pressure that is too low increases ion sputtering that causes surface deformation, or faceting of film edges and/or corners. For radicals formed remotely from the processing volume, ion sputtering is not a concern because these processes include ion filters that screen ions before entering the processing volume. However, for radicals formed both inside or outside the processing volume, it has been found that radical density is limited at low pressures which limits the reactants used to heal the film seam. Operating at pressures that are too high affects the ability for plasma to sustain itself in the chamber. Thus, an operating pressure in a range of from about 0.1 torr to about 10 torr, or in a range of from about 0.3 torr to about 8 torr, is used within the chamber.

The nitrogen plasma, and the nitrogen radical is formed from a nitrogen-containing gas, such as nitrogen ($N_2$) gas. The film 130 is exposed to the nitrogen plasma for a range of from about 100 seconds to about 600 seconds, such as from about 200 seconds to about 400 seconds, such as about 300 seconds. In some embodiments, the nitrogen plasma is introduced to the processing chamber with a first gas. The first gas may be selected from one or more of hydrogen ($H_2$), argon (Ar), krypton (Kr), xenon (Xe), nitrogen ($N_2$), helium (He), neon (Ne), and combinations thereof. In one or more embodiments, the nitrogen plasma is introduced to the processing volume at a flow rate of about 0.1 standard liters per minute (slm) to about 10 slm, such as from about 1 slm to about 6 slm, such as about 2 slm to about 4 slm, such as about 3 slm, or about 4 slm, or about 5 slm. The nitrogen plasma is introduced to the processing volume with a first gas, the first gas can include argon and hydrogen gas. In some embodiments, nitrogen-containing gas can be introduced into the processing volume and the nitrogen-containing molecules can be dissociated to nitrogen radicals by energizing the nitrogen-containing molecules with an RF source.

In one or more embodiments, the components of the first gas, such as argon and/or hydrogen, can promote the dissociation of nitrogen molecules to nitrogen radicals. In at least one example, the nitrogen plasma flowing into the processing chamber is in a range of from about 40% to about 100% by volume of the total gas flowing into the processing volume. In some embodiments, in operation 206, the argon gas can flow into the processing volume at a rate in a range of from about 0.1 slm about 10 slm, such as from about 1 slm to about 6 slm, such as from about 2 slm to about 4 slm, such as about 3 slm, or about 4 slm, or about 5 slm. In at least one example, in operation 206, the argon gas flowing into the processing chamber is about 0% to about 50% by volume of the total gas flowing into the processing volume in operation 206. In some embodiments, which can be combined with other embodiments, in operation 206, the hydrogen gas can flow into the processing volume at a rate of from about 0.1 slm about 5 slm, such as from about 0.1 slm to about 1 slm, such as about 0.2 slm to about 0.5 slm, such as about 0.3 slm, or about 0.4 slm, or about 0.5 slm. In at least one example, the hydrogen gas flowing into the processing chamber is about 0% to about 50% by volume of the total gas flowing into the processing volume in operation 206.

While aspects above describe the formation of nitrogen radicals using a remote plasma source, it is contemplated that nitrogen radicals may be generated using a direct plasma.

Figure 5:
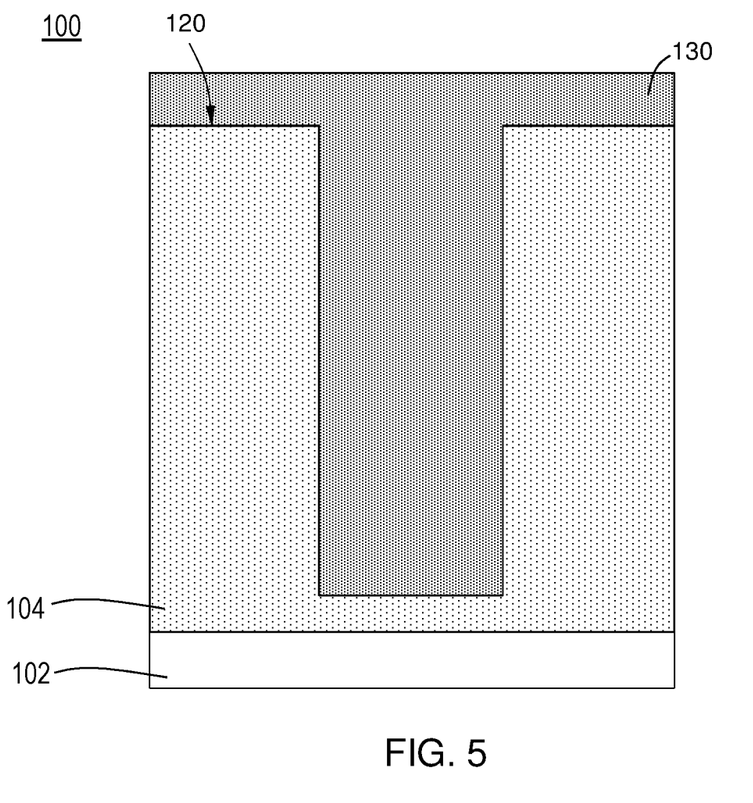
FIG. 5 illustrates a cross-sectional view of an electronic device accordance with one or more embodiments of the disclosure and FIG. 6 illustrates a cross-sectional view of a cluster tool in accordance with one or more embodiments of the disclosure.

Referring to FIG. 1 and FIG. 5, at operation 208, the device 100 is annealed. Annealing causes the void or gap 140 to close, such that the film 130 is substantially free of a void or gap. As used in this regard, the term "substantially free of a void or gap" means that any gap formed in the film between the sidewalls is less than about 1% of the cross-sectional area of the sidewall. In one or more embodiments, the width of the void or gap 140 of the film 130 is less than about 1 Å. In specific embodiments, no void or gap is observed under transmission electron microscopy ("TEM") imaging.

In one or more embodiments, annealing the film 130 comprises a rapid thermal processing (RTP) process where the substrate is subjected to temperatures greater than or equal to about 500° C., including greater than or equal to about 550° C., greater than or equal to about 600° C., greater than or equal to about 650° C., greater than or equal to about 700° C., greater than or equal to about 750° C., greater than or equal to about 800°, greater than or equal to about 850° C., greater than or equal to about 900° C., greater than or equal to about 950° C., or greater than or equal to about 1000° C. In some embodiments, anneal the film 130 comprises a rapid thermal processing (RTP) process where the substrate is exposed to temperatures in a range of from about 500° C. to about 1050° C. In one or more embodiments, the substrate 100 is annealed for a period of time in a range of from about 10 seconds to about 10 minutes.

Without intending to be bound by theory, it is believe that exposing the film 130 to high temperature anneal permits "healing" and reduction of the void or gap 140 width by promoting crystal/growth of the film 130.

According to one or more embodiments, the substrate 100, at operation 210, may be subjected to processing after annealing. This processing can be performed in the same chamber or in one or more separate processing chambers.

In some embodiments, the substrate is moved from a first chamber to a separate, next chamber for further processing. The substrate can be moved directly from the first chamber to the separate processing chamber, or the substrate can be moved from the first chamber to one or more transfer chambers, and then moved to the separate processing chamber. In some embodiments, the deposition of the metal film and the plasma treatment can be done in a single chamber, and then the annealing can be performed in a separate chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants (e.g., reactant). According to one or more embodiments, a purge gas is injected at the exit of the deposition chamber to prevent reactants (e.g., reactant) from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed and unloaded before another substrate is processed. The substrate can also be processed in a continuous manner, similar to a conveyer system, in which multiple substrate are individually loaded into a first part of the chamber, move through the chamber and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated (about the substrate axis) continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

Figure 6:
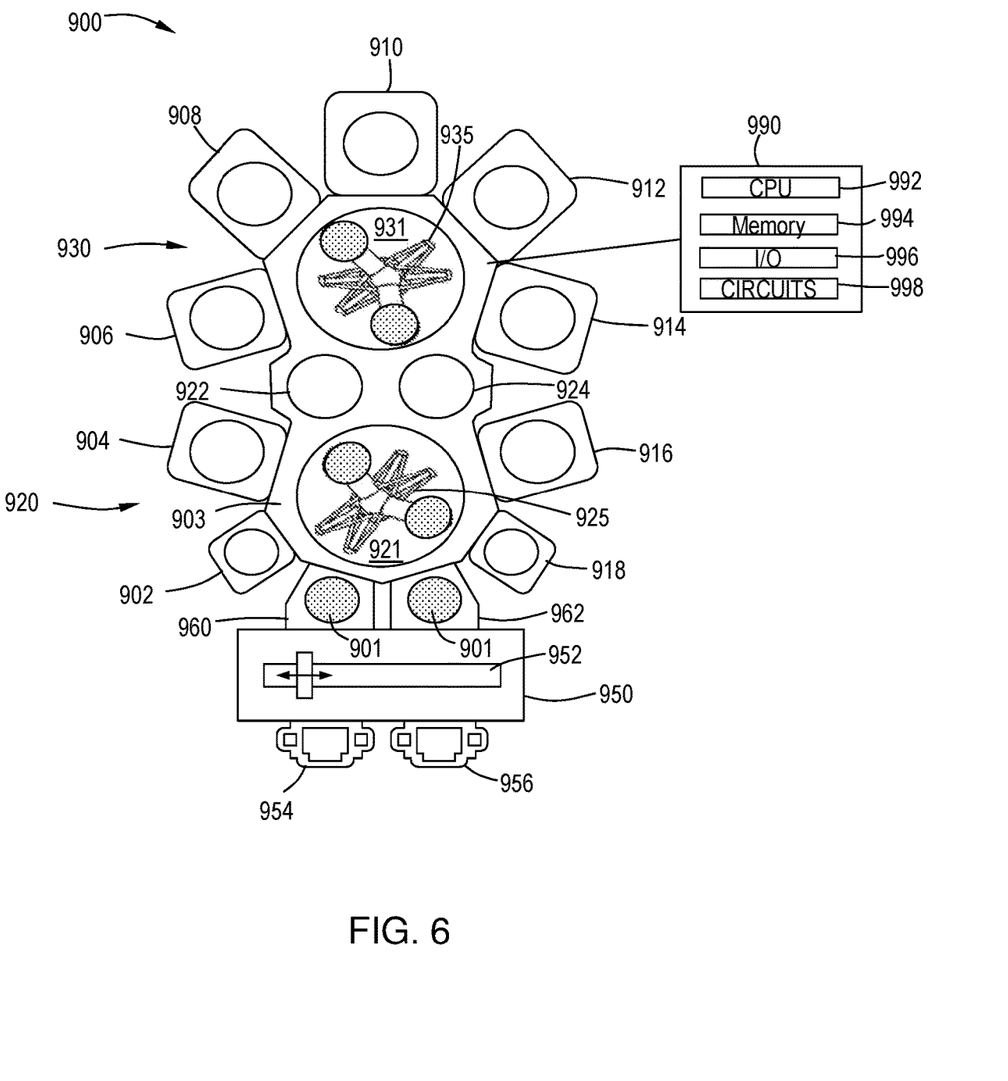

Additional embodiments of the disclosure are directed to processing tools 900 for the formation of the devices and practice of the methods described, as shown in FIG. 6. The cluster tool 900 includes at least one central transfer station 921, 931 with a plurality of sides. A robot 925, 935 is positioned within the central transfer station 921, 931 and is configured to move a robot blade and a wafer to each of the plurality of sides.

The cluster tool 900 comprises a plurality of processing chambers 902, 904, 906, 908, 910, 912, 914, 916, and 918, also referred to as process stations, connected to the central transfer station. The various processing chambers provide separate processing regions isolated from adjacent process stations. The processing chamber can be any suitable chamber including, but not limited to, a physical vapor deposition chamber, a plasma treatment chamber, an annealing chamber, and the like. The particular arrangement of process chambers and components can be varied depending on the cluster tool and should not be taken as limiting the scope of the disclosure.

In the embodiment shown in FIG. 6, a factory interface 950 is connected to a front of the cluster tool 900. The factory interface 950 includes a loading chamber 954 and an unloading chamber 956 on a front 951 of the factory interface 950. While the loading chamber 954 is shown on the left and the unloading chamber 956 is shown on the right, those skilled in the art will understand that this is merely representative of one possible configuration.

The size and shape of the loading chamber 954 and unloading chamber 956 can vary depending on, for example, the substrates being processed in the cluster tool 900. In the embodiment shown, the loading chamber 954 and unloading chamber 956 are sized to hold a wafer cassette with a plurality of wafers positioned within the cassette.

A robot 952 is within the factory interface 950 and can move between the loading chamber 954 and the unloading chamber 956. The robot 952 is capable of transferring a wafer from a cassette in the loading chamber 954 through the factory interface 950 to load lock chamber 960. The robot 952 is also capable of transferring a wafer from the load lock chamber 962 through the factory interface 950 to a cassette in the unloading chamber 956. As will be understood by those skilled in the art, the factory interface 950 can have more than one robot 952. For example, the factory interface 950 may have a first robot that transfers wafers between the loading chamber 954 and load lock chamber 960, and a second robot that transfers wafers between the load lock 962 and the unloading chamber 956.

The cluster tool 900 shown has a first section 920 and a second section 930. The first section 920 is connected to the factory interface 950 through load lock chambers 960, 962. The first section 920 includes a first transfer chamber 921 with at least one robot 925 positioned therein. The robot 925 is also referred to as a robotic wafer transport mechanism. The first transfer chamber 921 is centrally located with respect to the load lock chambers 960, 962, process chambers 902, 904, 916, 918, and buffer chambers 922, 924. The robot 925 of some embodiments is a multi-arm robot capable of independently moving more than one wafer at a time. In some embodiments, the first transfer chamber 921 comprises more than one robotic wafer transfer mechanism. The robot 925 in first transfer chamber 921 is configured to move wafers between the chambers around the first transfer chamber 921. Individual wafers are carried upon a wafer transport blade that is located at a distal end of the first robotic mechanism.

After processing a wafer in the first section 920, the wafer can be passed to the second section 930 through a pass-through chamber. For example, chambers 922, 924 can be uni-directional or bi-directional pass-through chambers. The pass-through chambers 922, 924 can be used, for example, to cryo cool the wafer before processing in the second section 930, or allow wafer cooling or post-processing before moving back to the first section 920.

A system controller 990 is in communication with the first robot 925, second robot 935, first plurality of processing chambers 902, 904, 916, 918 and second plurality of processing chambers 906, 908, 910, 912, 914. The system controller 990 can be any suitable component that can control the processing chambers and robots. For example, the system controller 990 can be a computer including a central processing unit (CPU) 992, memory 994, inputs/outputs (I/O) 996, and support circuits 998. The controller 990 may control the processing tool 900 directly, or via computers (or controllers) associated with particular process chamber and/or support system components.

In one or more embodiments, the controller 990 may be one of any form of general-purpose computer processor that can be used in an industrial setting for controlling various chambers and sub-processors. The memory 994 or computer readable medium of the controller 990 may be one or more of readily available memory such as non-transitory memory (e.g. random access memory (RAM)), read only memory (ROM), floppy disk, hard disk, optical storage media (e.g., compact disc or digital video disc), flash drive, or any other form of digital storage, local or remote. The memory 994 can retain an instruction set that is operable by the processor (CPU 992) to control parameters and components of the processing tool 900.

The support circuits 998 are coupled to the CPU 992 for supporting the processor in a conventional manner. These circuits include cache, power supplies, clock circuits, input/output circuitry and subsystems, and the like. One or more processes may be stored in the memory 994 as software routine that, when executed or invoked by the processor, causes the processor to control the operation of the processing tool 900 or individual processing units in the manner described herein. The software routine may also be stored and/or executed by a second CPU (not shown) that is remotely located from the hardware being controlled by the CPU 992.

Some or all of the processes and methods of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 990 has one or more configurations to execute individual processes or sub-processes to perform the method. The controller 990 can be connected to and configured to operate intermediate components to perform the functions of the methods. For example, the controller 990 can be connected to and configured to control a physical vapor deposition chamber.

Processes may generally be stored in the memory 994 of the system controller 990 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the system controller 990 has a configuration to control a chemical vapor deposition chamber to deposit a metal film on a substrate at a temperature in the range of from about 100° C. to about 600° C. and control a remote plasma source to treat the metal film on the substrate, followed by a configuration to anneal the substrate at a temperature in a range of from about 500° C. to about 1050° C.

In one or more embodiments, a processing tool comprises: a central transfer station comprising a robot configured to move a wafer; a plurality of process stations, each process station connected to the central transfer station and providing a processing region separated from processing regions of adjacent process stations, the plurality of process stations comprising a deposition chamber, a plasma treatment chamber, a remote plasma source, an annealing chamber, and a controller connected to the central transfer station and the plurality of process stations, the controller configured to activate the robot to move the wafer between process stations, and to control a process occurring in each of the process stations.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A processing method consisting essentially of:
   forming a metal film directly on a substrate surface, the metal film selected from the group consisting of titanium nitride (TiN), tantalum nitride (TaN), tungsten nitride (WN), molybdenum nitride (MoN), titanium aluminum nitride (TiAlN), niobium nitride (NbN), vanadium nitride (VN), chromium nitride (CrN), and rubidium nitride (RbN), the substrate surface having at least one feature thereon, the at least one feature having a width defined by a first sidewall and a second sidewall, wherein the metal film is formed on the substrate surface, the first sidewall, the second sidewall, and a bottom surface of the at least one feature, the metal film having a void located within the width of the feature, the void having a first width;
   treating the metal film with a plasma to decrease the first width of the void to a second width; and
   annealing the metal film to close the void.

2. The method of claim 1, wherein the plasma comprises nitrogen.

3. The method of claim 1, wherein the plasma is selected from the group consisting of a remote plasma and a direct plasma.

4. The method of claim 1, wherein the metal film comprises titanium nitride (TiN).

5. The method of claim 1, wherein forming the metal film comprises an atomic layer deposition process.

6. The method of claim 1, wherein the feature has an aspect ratio greater than or equal to about 10:1.

7. The method of claim 1, wherein the depth of the at least one feature is in a range of about 50 nm to about 100 nm.

8. The method of claim 1, wherein the void extends substantially parallel to the first and second sidewalls.

9. A processing method consisting essentially of:
forming a film stack on a substrate, the film stack comprising a plurality of alternating layers of an oxide material and a nitride material and the film stack having a stack thickness;
etching the film stack to form an opening extending a depth from a top of the film stack surface to a bottom surface, the opening having a width defined by a first sidewall and a second sidewall;
forming a metal film directly on the film stack, wherein the metal film is selected from the group consisting of titanium nitride (TiN), tantalum nitride (TaN), tungsten nitride (WN), molybdenum nitride (MoN), titanium aluminum nitride (TiAlN), niobium nitride (NbN), vanadium nitride (VN), chromium nitride (CrN), and rubidium nitride (RbN), the metal film is formed on the top of the film stack surface, the first sidewall, the second sidewall, and the bottom surface of the opening, the metal film having a void located within the width of the opening, the void having a first width;
treating the metal film with a plasma to decrease the first width of the void to a second width; and
annealing the metal film to close the void.

10. The method of claim 9, wherein the plasma comprises nitrogen.

11. The method of claim 9, wherein the plasma is selected from the group consisting of a remote plasma and a direct plasma.

12. The method of claim 9, wherein the void extends substantially parallel to the first and second sidewalls.

13. A non-transitory computer readable medium including instructions, that, when executed by a controller of a processing chamber, causes the processing chamber to perform operations consisting essentially of:
Forming a metal film directly on a substrate surface, the metal film selected from the group consisting of titanium nitride (TiN), tantalum nitride (TaN), tungsten nitride (WN), molybdenum nitride (MoN), titanium aluminum nitride (TiAlN), niobium nitride (NbN), vanadium nitride (VN), chromium nitride (CrN), and rubidium nitride (RbN), the substrate surface having at least one feature thereon, the at least one feature having a width defined by a first sidewall and a second sidewall, wherein the metal film is formed on the substrate surface, the first sidewall, the second sidewall, and a bottom surface of the at least one feature, the metal film having a void located within the width of the feature, the void having a first width;
treating the metal film with a plasma to decrease the first width of the void to a second width; and
annealing the metal film to close the void.

14. The non-transitory computer readable medium of claim 13, wherein the plasma comprises nitrogen.

15. The non-transitory computer readable medium of claim 13, wherein the void extends substantially parallel to the first and second sidewalls.

\* \* \* \* \*